(12) United States Patent  (10) Patent No.: US 8,593,212 B2
Hou et al.  (45) Date of Patent: Nov. 26, 2013

(54) SIGNAL NOISE RATIO CONTROL SYSTEM AND METHOD THEREOF

(75) Inventors: Chun-Cheng Hou, Pingzhen (TW); Chien-Lin Yeh, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/565,251

(22) Filed: Aug. 2, 2012

(65) Prior Publication Data

US 2013/0257518 A1  Oct. 3, 2013

(30) Foreign Application Priority Data

Mar. 27, 2012 (TW) ............................. 101110609 A

(51) Int. Cl.
*H03K 17/94* (2006.01)
(52) U.S. Cl.
USPC .......................................... 327/517; 345/174
(58) Field of Classification Search
USPC ....................................................... 327/517
See application file for complete search history.

(56) References Cited

U.S. PATENT DOCUMENTS

| 5,543,588 | A  | * | 8/1996 | Bisset et al. ............... 178/18.06 |
| 8,035,622 | B2 | * | 10/2011 | Hotelling et al. ............ 345/173 |
| 8,054,299 | B2 | * | 11/2011 | Krah ............................ 345/174 |
| 2008/0158178 | A1 |   | 7/2008 | Hotelling et al. |
| 2011/0042152 | A1 | * | 2/2011 | Wu ............................. 178/18.03 |
| 2013/0120053 | A1 | * | 5/2013 | Mei et al. ..................... 327/517 |

FOREIGN PATENT DOCUMENTS

JP   2009-154208   7/2009
TW   201115443   5/2011

OTHER PUBLICATIONS

English translation of abstract of TW 201115443, May 1, 2011.
English translation of abstract of JP 2009-154208, Jul. 16, 2009.

* cited by examiner

*Primary Examiner* — Lincoln Donovan
*Assistant Examiner* — Terry L Englund
(74) *Attorney, Agent, or Firm* — CKC & Partners Co., Ltd.

(57) ABSTRACT

A signal-noise ratio control system which reduces noise interference includes a touch sensor, a touch controller, and a level shifter. The touch sensor is driven by a driving signal and outputs an analog signal based on a touch situation. The touch controller generates the driving signal and provides a divided voltage based on the analog signal. The level shifter adjusts a voltage level of the driving signal based on a voltage level of the divided voltage.

10 Claims, 3 Drawing Sheets

SIGNAL NOISE RATIO CONTROL SYSTEM AND METHOD THEREOF

RELATED APPLICATIONS

This application claims priority to Taiwan Application Serial Number 101110609, filed Mar. 27, 2012, which is herein incorporated by reference.

BACKGROUND

1. Technical Field

The present invention relates to a touch panel and a method thereof, and more particularly to a touch panel and a related method for reducing noises.

2. Description of Related Art

Various kinds of touch panels have been applied on computers and mobile phones along with the rapid developments of the society and the technology. The conventional I/O device such as keyboards, mice, and trace ball has become insufficient to meet the market requirements any more due to such rapid development of the technology like the wireless networking. Touch panels, for their convenient handling ability, has been commonly applied on various kinds of consumer electronics, in which the capacitive touch panels particularly become more and more popular.

With the intrinsic conductive characteristics of human beings, the capacitance of between fingers and electrodes changes as the fingers approaches the electrodes for delivering current. Accordingly, touch sensors of the capacitive touch panels are usually implemented with conductive electrodes. When the fingers or touching elements touching certain points of the touch panels to change the capacitances of those points, the changed capacitances indicate the touched locations which are provided for a computer system.

However, analog signals outputted from the touch sensors are easily interfered with noises like power noises, display module noises, or radio waves. As such, the computer system cannot correctly process and determine touch sensor statuses, which affect operation and quality of the display device.

SUMMARY

According to one embodiment of the present invention, a signal-noise ratio control system for reducing the noise interference is disclosed, in which the signal-noise ratio control system includes a touch sensor, a touch controller, and a level shifter. The touch sensor is driven by a driving signal and outputs at least an analog signal according to a plurality of touch statuses. The touch controller generates the driving signal and provides a divided voltage according to the analog signals. The level shifter adjusts a voltage level of the driving signal according to the voltage level of the divided voltage.

According to another embodiment of the present invention, a method which controls the signal-noise ratio for reducing noise interference is disclosed, in which the method converts an analog signal into a plurality of original digital signals; analyzes the original digital signals; determines whether a voltage level of a driving signal needs changing according to the analyzing of the original digital signals; selects a new divided voltage when the voltage level of the driving signal needs changing; adjusts the voltage level of the driving signal according to the new divided voltage or an original divided voltage; and drives a touch sensor with the driving signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
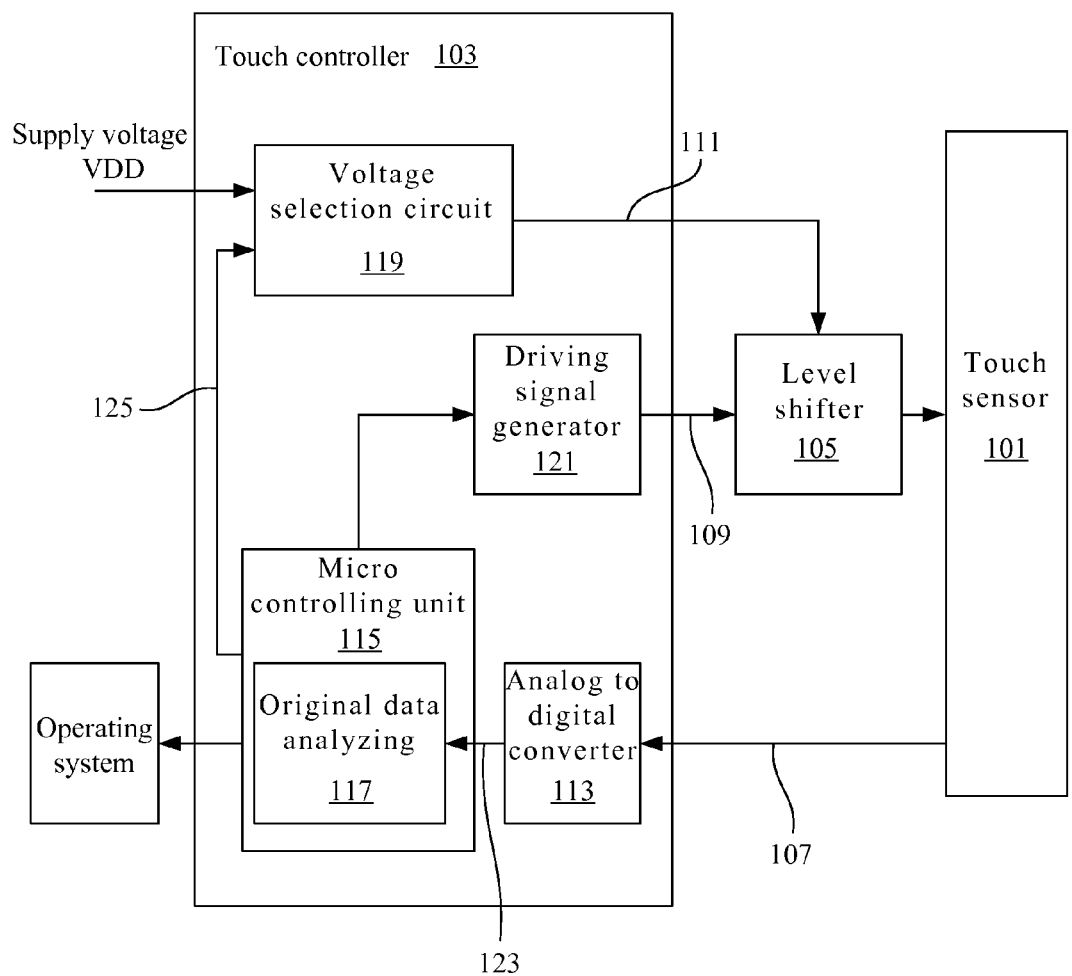
FIG. 1 is a block diagram of a signal-noise ratio control system according to one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

Noises are usually transmitted and amplified along with the sensed analog signal and are not easily controlled, which makes noise suppression more difficult. Enhancing signal-noise ration is an effective way to reduce impact of noise interference, which increases voltage level of a driving signal. As a result, voltage value of the analog signal sensed by the touch controller is increased, and the noise can be ignored.

A signal-noise ratio control system and a method which controls the signal-noise ratio of following embodiments can detect current noise statues in advance, and voltage selection circuit can choose proper voltage inputted to the level shifter according to the sensed noise statues. Then the voltage of the driving signal can be pulled up to proper level by the level shifter. Therefore, it is not necessarily to maintain a high voltage all the time to improve the signal-noise ratio, which reduces the power consumption.

FIG. 1 is a block diagram of a signal-noise ratio control system according to one embodiment of this disclosure. The signal-noise ratio control system reducing the noise interference includes a touch sensor 101, a touch controller 103, and a level shifter 105.

The touch sensor 101 is driven by a driving signal 109 and outputs an analog signal according to a plurality of touch statuses. The touch sensor 101 is usually implemented with conductive electrodes. When certain points are touched by fingers or touching elements which change capacitances of those points, the changed capacitances indicate the touched locations that are provided for computer system. For example, the touched locations can be provided to windows operating system, Linux operating system, or Android operating system. The electrodes of the touch sensor 101 can be diamond pattern, strip pattern, or other capacitive sensing designs, in which the capacitive sensing designs can be classified as charging/discharging transform method or RC oscillating method according to their pattern shapes.

The touch controller 103 generates the driving signal 109, such as a pulse width signal, for driving the touch sensor 101. The touch controller 103 also provides a divided voltage 111 according to the analog signals 107 outputted from touch sensor 101. The level shifter 105 adjusts a voltage level of the driving signal 109 according to the voltage level of the divided voltage 111. For example, the voltage level of the driving signal 109 can to adjusted to 18V such that the voltage level of the analog signal 107 is increased as well, which improves the signal-noise ratio of the analog signal and the noise preventing ability. Particularity, if the noise condition is not too bad and the voltage level of the driving signal 109 can keeps as the same and needs not changing, the touch sensor 101 can be driven with the original driving signal 109; that is, if the noise situation is not too serious and the system can still operate correctly, the touch sensor 101 can be driven with the original 3.3V driven signal.

The touch controller 103 includes an analog to digital converter 113, a micro controlling unit 115, and a voltage selection circuit 119. The analog to digital converter 113 converts the analog signal 107 outputted from the touch sensor 101 into plenty of original digital signals (raw data) 123. The value of the original digital signal 123 represents time period required for charging a specific point to an expected voltage, in which the time period is estimated according to pulse number of the driving signal 109. In addition, the value of the original digital signal 123 is related to noise volume; in general, the greater the original digital signal 123 is, the more serious the noise situation is, and the voltage level of the driving signal require increasing.

The micro controlling unit 115 analyzes the original digital signals 123 and generates a selecting control signal 125 according to the original digital signals 123. The micro controlling unit 115 includes an original data analyzing circuit 117 which analyzes value of the original digital signal 123 and selects out the original digital signals 123 having values within certain range. For example, the original data analyzing circuit 117 can select original digital signals 123 having values within top 20% of total values.

If the values of the original digital signal 123 ranges from 0 to 1000, then the original digital signals 123 having values from 800 to 1000 are selected. Next, the selecting control signal 125 can be generated according to the selected original digital signals 123. For example, the selected original digital signals 123 having values from 800 to 1000 can be averaged to derive the mean value of the original digital signals. Generally, the mean value of the original digital signals increases as the noise condition are getting worse. After that, the mean value of the original digital signals is compared with a predetermined value, and selecting control signal 125 is accordingly generated. The voltage selection circuit 119 generates the divided voltage according to the selecting control signal 125. The voltage level of the generated divided voltage is increasing as the noise condition is getting worse.

The touch controller 103 further includes a driving signal generator 121 controlled by the micro controlling unit 115 for adjusting strength and frequency of the driving signal 109.

Figure 2:
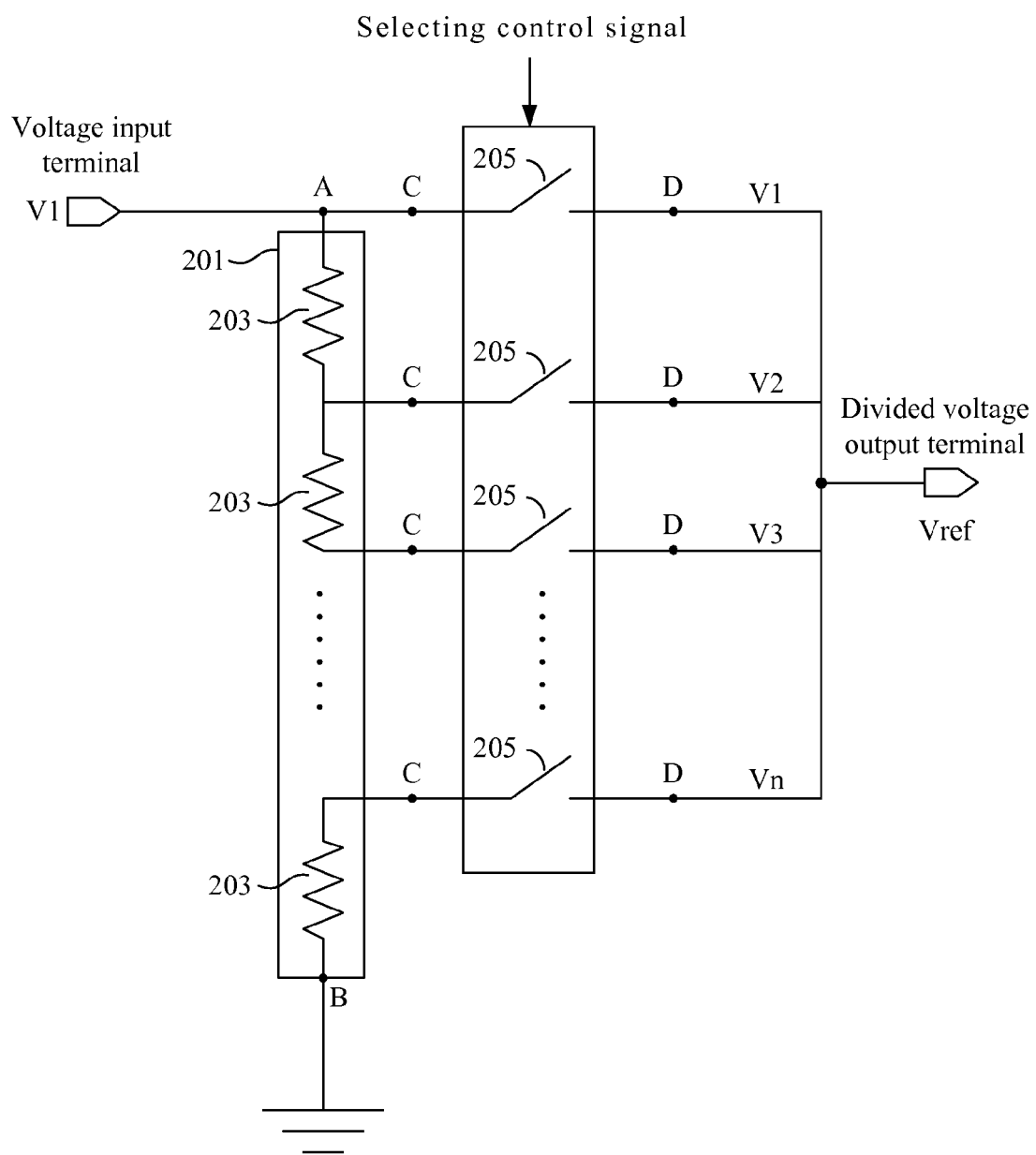
FIG. 2 is a circuit diagram of a voltage selection circuit according to one embodiment of this disclosure.

FIG. 2 is a circuit diagram of a voltage selection circuit according to one embodiment of this disclosure. The voltage selection circuit includes a resistor string 201 and plenty of switch elements 205. The resistor string 201 includes plenty of resistors 203 connected in series, in which the resistor string 201 has one end A connected to a voltage input terminal for receiving and dividing a supply voltage V1 and has the other end B being grounding.

Each switch element 205 has a first end C connected to a corresponding resistor 203 and has a second end D connected to a divided voltage output terminal, in which conductions of the switch elements 205 are controlled by the selecting control signal for connecting a resistor terminal D of the resistors 203 to the divided voltage output terminal and for outputting the divided voltage Vref.

Figure 3:
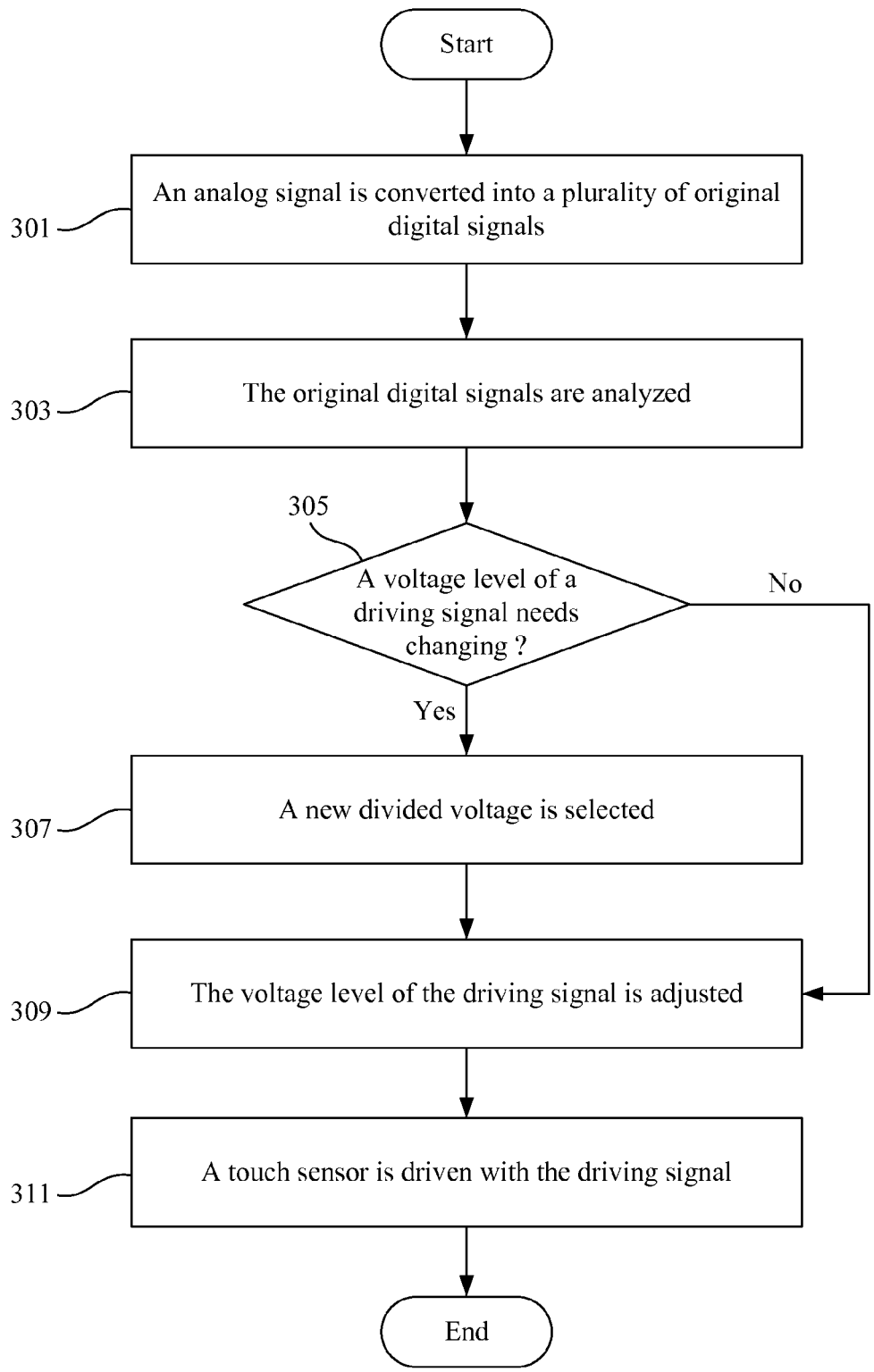
FIG. 3 is a flowchart of a method which controls the signal-noise ratio according to one embodiment of this disclosure.

FIG. 3 is a flowchart of a method which controls the signal-noise ratio according to one embodiment of this disclosure. The method actually controls the signal-noise ratio for reducing noise interference. An analog signal is first converted into a plurality of original digital signals (step 301) and the original digital signals are analyzed (step 303). The values of the digital original signals related to noises under various condition can be different. The voltage level of the driving signal can be made equal to original supply voltage VDD (3.3V), and the original digital signal corresponding to each location is analyzed to learn the noise condition.

In the analyzing step 303, the original digital signals having values within certain range are first selected out; for example, the original digital signals having values within top 20% are first selected out, and the selected original digital signals are averaged to derive a mean value of the original digital signal.

After that, a voltage level of a driving signal is determined whether it needs changing according to the analyzing of the original digital signals (step 305), in which the mean value of the original digital signal is compared with a standard value. When the mean value of the original digital signal is greater than the standard value, which means the noise is serious, the voltage level of the driving signal needs changing, and a new divided voltage is selected (step 307). In detail, if the noise is serious, the divided voltage having a higher voltage level is re-selected; on the other hand, if the noise is not serious, the divided voltage having a lower voltage level is re-selected.

After that, the voltage level of the driving signal is adjusted according to the new divided voltage or an original divided voltage (step 309); particularly, if the driving signal is determined it needs changing in step 305, the voltage level of the driving signal is adjusted according to the new divided voltage; if the driving signal is determined it doesn't need changing in step 305, the voltage level of the driving signal is adjusted according to the original divided voltage. Furthermore, if the selected new divided voltage is equally to 18V, the voltage level of the driving signal to adjusted to be equal to the voltage level of the divided voltage. Then, a touch sensor is driven with the driving signal which has been adjusted (step 311) to improve the signal-noise ration of the analog signal outputted from the touch sensor.

The signal-noise ratio control system and the method which controls the signal-noise ratio of the above embodiments can detect current noise condition in advance, and voltage selection circuit can choose proper voltage inputted to the level shifter according to the sensed noise statues. Then the voltage of the driving signal can be pulled up to proper level by the level shifter. Therefore, it is not necessarily to maintain a high voltage all the time to improve the signal-noise ratio, which reduces the power consumption.

It will be apparent to those skilled in the art that various modifications and variations can be made to the structure of the present invention without departing from the scope or spirit of the disclosure. In view of the foregoing, it is intended that the present invention cover modifications and variations of this disclosure provided they fall within the scope of the following claims.

What is claimed is:

1. A signal-noise ratio control system for reducing noise interference, the signal-noise ratio control system comprising:
   a touch sensor driven by a driving signal and outputting an analog signal according to a plurality of touch statuses;
   a touch controller which generates the driving signal and provides a divided voltage according to the analog signal; and
   a level shifter which adjusts a voltage level of the driving signal according to a voltage level of the divided voltage.

2. The signal-noise ratio control system as claimed in claim 1, wherein the touch controller comprises:
- an analog to digital converter which converts the analog signal outputted from the touch sensor into a plurality of original digital signals;
- a micro controlling unit which analyzes the original digital signals and generates a selecting control signal according to the original digital signals; and
- a voltage selection circuit which generates the divided voltage according to the selecting control signal.

3. The signal-noise ratio control system as claimed in claim 2, wherein the micro controlling unit comprises an original data analyzing circuit which analyzes values of the original digital signals and selects out the original digital signals having values within a certain range.

4. The signal-noise ratio control system as claimed in claim 3, wherein the micro controlling unit generates the selecting control signal according to the selected original digital signals.

5. The signal-noise ratio control system as claimed in claim 2, wherein the voltage selection circuit comprises:
- a resistor string comprising a plurality of resistors connected in series, wherein the resistor string has one end connected to a voltage input terminal for receiving and dividing a supply voltage and has the other end being grounding;
- a plurality of switch elements, wherein each switch element has a first end connected to a corresponding resistor and has a second end connected to a divided voltage output terminal,
- wherein conductions of the switch elements are controlled by the selecting control signal for connecting a resistor terminal of the resistors to the divided voltage output terminal and for outputting the divided voltage.

6. The signal-noise ratio control system as claimed in claim 2, wherein the touch controller further comprises:
- a driving signal generator controlled by the micro controlling unit for adjusting strength and frequency of the driving signal.

7. A method which controls a signal-noise ratio for reducing noise interference comprising the steps of:
- converting an analog signal into a plurality of original digital signals;
- analyzing the original digital signals;
- determining whether a voltage level of a driving signal needs changing according to the analyzing of the original digital signals;
- selecting a new divided voltage when the voltage level of the driving signal needs changing;
- adjusting the voltage level of the driving signal according to the new divided voltage or an original divided voltage; and
- driving a touch sensor with the driving signal.

8. The method which controls the signal-noise ratio for reducing noise interference as claimed in claim 7, wherein the step of original digital signals analyzing comprising:
- selecting the original digital signals which have values within a certain range; and
- averaging the original digital signals that have been selected for deriving a mean value of the original digital signals.

9. The method which controls the signal-noise ratio for reducing noise interference as claimed in claim 8, wherein the mean value of the original digital signals is compared with a standard value, and the voltage level of the driving signal needs changing when the mean value of the original digital signals is greater than the standard value.

10. The method which controls the signal-noise ratio for reducing noise interference as claimed in claim 8, wherein the voltage level of the driving signal is adjusted to be equal to the voltage level of the original divided voltage or equal to the voltage level of the new divided voltage.

* * * * *